(12) United States Patent
Wickramanayaka

(10) Patent No.: US 6,333,601 B1
(45) Date of Patent: Dec. 25, 2001

(54) PLANAR GAS INTRODUCING UNIT OF A CCP REACTOR

(75) Inventor: Sunil Wickramanayaka, Tokyo (JP)

(73) Assignee: Anelva Corporation, Fuchu (JP)

( * ) Notice: Subject to any disclaimer, the term of this patent is extended or adjusted under 35 U.S.C. 154(b) by 0 days.

(21) Appl. No.: 09/453,900

(22) Filed: Mar. 28, 2000

(30) Foreign Application Priority Data

May 19, 1999 (JP) ............................. 11-139325

(51) Int. Cl.[7] ............................................. H01J 7/24
(52) U.S. Cl. ................ 315/111.41; 118/723 MR; 156/345
(58) Field of Search .................. 315/111.41, 111.21, 315/111.31, 111.71; 118/723 R, 723 ME, 723 MR, 723 MF, 723 DC, 723 ER, 723 IR; 156/345

(56) References Cited

U.S. PATENT DOCUMENTS 5,279,669 * 1/1994 Lee ........................... 118/723 MR
5,733,405 * 3/1998 Taki et al. ....................... 156/345

FOREIGN PATENT DOCUMENTS 11-283926  10/1999  (JP) .

OTHER PUBLICATIONS

Wickramanayaka et al., "Optimization of Plasma Density and Radial Uniformity of a Point–Cusp Magnetic Field Applied Capacitive Plasma", The Journal of Vacuum Science and Technology, May/Jun. 2000.

Wickramanayaka et al., "Magnetically Enhanced Dual Frequency Capacitively Coupled Plasma Source for Large–area Wafer Processing", Jpn. J. Appl. Phys., vol. 37 (1998), pp. 6193–6198.

* cited by examiner

*Primary Examiner*—Don Wong
*Assistant Examiner*—Ephrem Alemu
(74) *Attorney, Agent, or Firm*—Burns, Doane, Swecker & Mathis, LLP

(57) ABSTRACT

A planar gas introducing unit arranged within a capacitively coupled plasma (CCP) reactor includes a top electrode, a gas inlet plate having a plurality of gas inlet holes and a gas reservoir 20 formed between the top electrode and the gas inlet plate. The top electrode includes a plurality of magnets which are arranged such that the magnets operate to substantially prevent an enhanced erosion of the plurality of gas inlet holes. Each of the plurality of magnets can be arranged to correspond to a gas inlet hole such that an axis of each of the plurality of magnets is aligned with an axis of a corresponding gas inlet hole and magnetic fields emitted from the plurality of magnets pass through the gas inlet holes in a direction substantially corresponding to the axis of the corresponding gas inlet hole. The planar gas introducing unit of the present invention prevents plasma enhanced erosion generated at both ends of the gas inlet holes.

27 Claims, 4 Drawing Sheets

PLANAR GAS INTRODUCING UNIT OF A CCP REACTOR

CROSS-REFERENCE TO RELATED APPLICATIONS

Referenced-applications

The present application corresponds to and claims priority of Japanese Patent Application No. 11-139325, filed in Japan on May 19, 1999, the entire contents of which are incorporated herein by reference.

STATEMENT REGARDING FEDERALLY SPONSORED RESEARCH

Not Applicable

REFERENCE TO A MICROFICHE APPENDIX

Not Applicable

BACKGROUND OF THE INVENTION

Description of Related Art

Capacitively coupled plasma (CCP) reactors are utilized in a wide range of applications in the semiconductor device fabrication industry. CCP reactors have attracted great interest owing to their numerous advantages such as (1) a low aspect ratio of the plasma reactor due to a narrow gap between the cathode and the anode electrodes, (2) better radial uniformity of the plasma, (3) ease of plasma ignition, and (4) ability to use a shower-head-type planar gas introducing device to yield a better gas distribution.

One of the problems with CCP reactors concerns the nonuniform erosion of a gas inlet plate of the shower-head-type planar gas introducing unit. The gas inlet plate has a plurality of gas inlet holes which are subjected to a higher erosion rate by the plasma compared to other areas of the gas inlet plate. The erosion of the gas inlet holes occurs from a lower side as well as from an upper side thereof. The erosion process is explained in detail in accordance with FIGS. 4 and 5 below.

FIG. 4 shows a simplified diagram of one example of a CCP reactor 100. This CCP reactor 100 includes a top plate 51. a bottom plate 52, a cylindrical side wall 53, a top electrode 54 and a wafer holder 55. The top electrode 54 is arranged by a ring insulator 56 at the upper side of the CCP reactor 100 and the wafer holder 55 is arranged on the bottom plate 52 and supported by a planar insulator 57. Further, the insulator plate 58 is arranged between the top plate 51 and the top electrode 54. The top electrode 54 is made of a metal, for example, aluminum. Below the top electrode 54 there is a gas inlet plate 59. Between the top electrode 54 and the gas inlet plate 59, there is a narrow space 60 forming a gas reservoir. The purpose of the gas reservoir 60 is to provide a uniform gas distribution over the gas inlet plate 59. The material of the gas inlet plate 59 depends on the type of plasma application, for example, in dry etching applications, carbon or Si is usually used. In other applications, dielectric materials, for example, quartz or ceramic, are usually used. There is a large number of gas inlet holes 59a in the gas inlet plate 59 for the introduction of a process gas from the gas reservoir 60 to a plasma generation region. The diameter of the gas inlet holes 59a is approximately 0.5 mm. The separation between each of the gas inlet holes 59a may vary from 5 mm to 20 mm in an ordinary plasma source. However, regardless of the separation between the gas inlet holes 59a, an equal distance between the gas inlet holes 59a is usually kept. That is, gas inlet holes 59a are formed at the corners of identical squares drawn on the gas inlet plate 59. A wafer 61 to be processed is situated on the wafer holder 55. The wafer 61 faces the gas inlet plate 59 in a parallel fashion.

An RF power source 62 is connected to the top electrode 54 via a matching circuit 63. The RF power source 62 usually operates at a frequency in range of 10 MHz to 100 MHZ. When the RF electric power is supplied to the top electrode 54, a plasma is generated between the gas inlet plate 59 and the wafer holder 55 by a capacitively coupled mechanism. The plasma generation region, however, lies in the vicinity of the gas inlet plate 59, since an electron heating process primarily occurs by an oscillation of sheath voltage that lies just below the gas inlet plate 59. Therefore, a plasma density is higher, closer to the gas inlet plate 59 and gradually decreases in a downstream direction because of gas phase recombination and a ambipolar diffusion.

As mentioned above, a major problem associated with the gas inlet plate 59 is the high erosion rate of the gas inlet holes 59a by the plasma. This erosion results in a lower utilization efficiency of the gas inlet plate 59. The erosion process is explained below.

Plasma is usually generated at a low pressure, for example, in the range of 10 mTorr to 100 mTorr, in most present industrial applications. However, referring to FIG. 5, at an end 59a-1 of the gas inlet holes 59a there is a slightly higher gas pressure, and inside the gas reservoir 60 there is an even higher gas pressure. The plasma density changes depending on the pressure. At higher pressures, the plasma density becomes higher. In a capacitively coupled plasma, an RF electrode generally has a self bias voltage. In the situation explained above, the gas inlet plate 59 functions as the RF electrode and therefore, has a self bias voltage. The value and polarity of the self bias voltage generated in the gas inlet plate 59 depends on many parameters, for example, the surface area ratio of the cathode (the gas inlet plate) and the anode (all grounded surfaces where the plasma is in contact with), the operating frequency of the RF power source 62, and the plasma density, etc. In most of the plasma sources used in practical applications, the RF electrode attains a negative self bias voltage. Owing to this negative self bias voltage, the positive ions in the plasma accelerate towards the gas inlet plate 59 and bombard its surface. These ions gain a high energy by the acceleration process, thus the bombardment of ions on the gas inlet plate 59 causes a sputtering of the gas inlet plate 59. As explained above, the sputtering damage is higher at the gas inlet holes 59a, since there is a higher plasma density at these places. This process causes an extruded erosion of the gas inlet holes 59a compared to the other areas of the gas inlet plate 59, resulting in an enlargement of the diameter of the gas inlet hole 59a. With the increase of the gas inlet hole diameter, the plasma tends to confine in the gas inlet hole 59a by multi-reflections of electrons on the walls of gas inlet hole 59a. Accordingly, the erosion rate in the gas inlet hole 59a accelerates with the plasma-on time. This process yields a conical shaped gas inlet hole 64 at the lower end 59a-1 thereof, as shown in FIG. 5, after several hours of operation.

Similarly, micro-plasmas generated at an upper end 59a-2 of the gas inlet hole 59a causes an erosion of the upper side of the gas inlet hole 59a. Because of these erosion processes, a conical shaped gas inlet hole 65 is formed at the upper end 59a-2 thereof, as shown in FIG. 5. The service life of the gas inlet plate 59 is limited by the condition that the eroded upper and lower ends of the gas inlet hole 59a are joined. As a result, usually thicker, approximately 10 mm, gas inlet plates are used with CCP reactors 100 in order to increase their service life. However, the gas inlet plate 59 has a very low utilization efficiency since the erosion of gas inlet holes 59*a* determines its service life.

Moreover, if a polymer deposition gas chemistry is used in generating the plasma, a polymer deposition 66 can be observed in an area on the lower surface of the top electrode 54, which is just above the gas inlet hole 59*a* as shown in FIG. 5. The polymer deposition 66 can be attributed to the following two reasons. (1) Due to the micro-plasma generated at the upper end 59*a*-2 of gas inlet hole 59*a*, polymer depositing radicals are formed. (2) The polymer depositing radicals generated in the main plasma below the gas inlet plate 59 can diffuse through the gas inlet hole 59*a*. This diffusion process increases with an increase of the gas inlet hole diameter with plasma-on time. Before the thickness of the layer formed by the polymer deposition 66 becomes thick enough to peel off and release into the plasma as micro-particles, the processing of the wafer 61 based on the plasma in the CCP reactor 100 should be stopped. Existence of the micro-particles in the plasma causes faulty devices.

FIELD OF THE INVENTION

The present invention relates to a planar gas introducing unit of a capacitively coupled plasma (CCP) reactor, and more particularly, to a planar gas introducing unit installed in a CCP reactor, which is capable of minimizing or preventing the erosion of gas inlet holes in the gas inlet plate in order to enhance the service life and utilization efficiency of the gas inlet plate.

BRIEF SUMMARY OF THE INVENTION

An object of the present invention is to provide a planar gas introducing unit of a capacitively coupled plasma (CCP) reactor including a gas inlet plate, having a longer service life and a higher utilization efficiency, by suppressing the plasma enhanced erosion of gas inlet holes of the gas inlet plate.

According to a first exemplary embodiment, the planar gas introducing unit is arranged within a CCP reactor and includes a top electrode, a gas inlet plate having a plurality of gas inlet holes and a gas reservoir formed between the top electrode and the gas inlet plate. The top electrode of the planar gas introducing unit of the present invention also includes a plurality of magnets arranged such that the magnets operate to substantially prevent the enhanced erosion of the plurality of gas inlet holes. For example, in a preferred embodiment, the plurality of magnets are situated in a spaced relationship relative to one another on a surface of the top electrode and are arranged across from the plurality of gas inlet holes of the gas inlet plate.

Still other objects, features, and attendant advantages of the present invention will become apparent to those skilled in the art from a reading of the following detailed description of embodiments constructed in accordance therewith, taken in conjunction with the accompanying drawings.

BRIEF DESCRIPTION OF THE SEVERAL VIEWS OF THE DRAWINGS

The invention of the present application will now be described in more detail with reference to preferred embodiments of the apparatus and method, given only by way of example, and with reference to the accompanying drawings, in which.

DETAILED DESCRIPTION OF THE INVENTION

Figure 1:
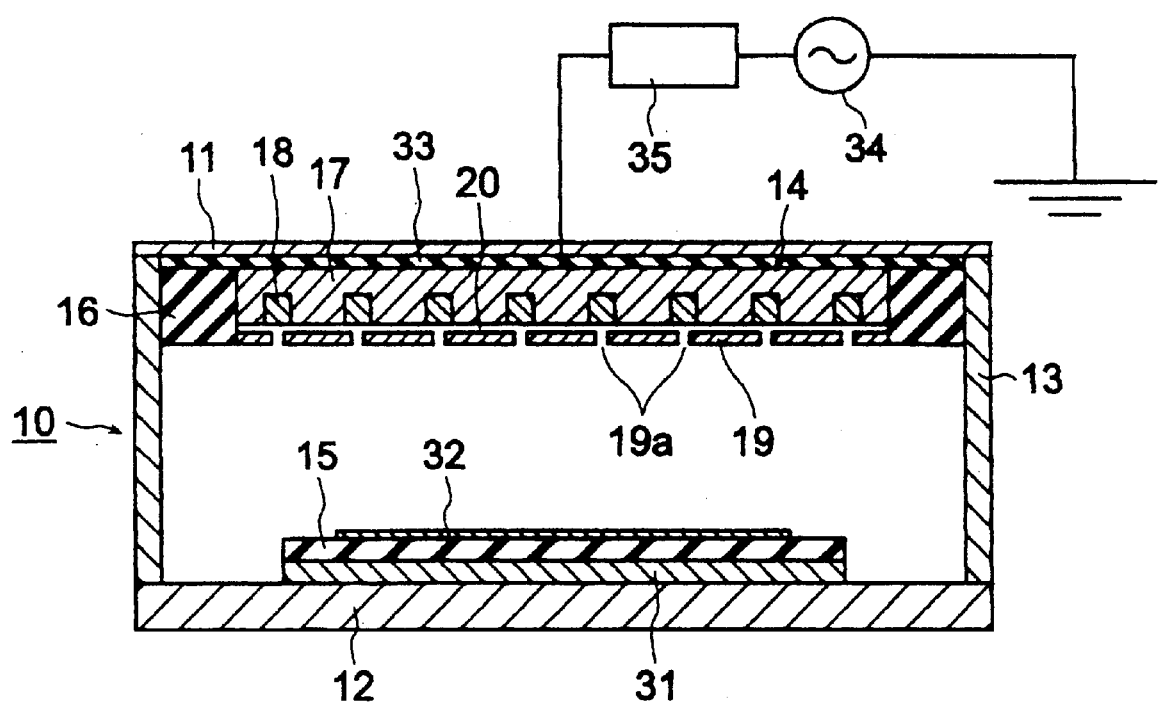
FIG. 1 shows a cross sectional view of a capacitively coupled plasma source including a gas inlet plate of the present invention.

Referring to the drawing figures, like reference numerals designate identical or corresponding elements throughout the several figures. Hereinafter, preferred working examples will be explained according to the attached drawings. Through the explanation of the working examples, the details of the present invention will be clarified. The working example of the present invention is explained in accordance with FIGS. 1 and 2. FIG. 1 shows a simplified diagram of a capacitively coupled plasma (CCP) reactor 10 with a preferred embodiment of the planar gas introducing unit of the present invention. The CCP reactor 10 includes a top plate 11, a bottom plate 12, and a cylindrical side wall 13 and has a planar gas introducing unit 14 and a substrate holder 15 situated inside. The planar gas introducing unit 14 is fixed to an upper section of the cylindrical side wall 13 through a ring insulator 16. The planar gas introducing unit 14 includes a top electrode 17, a plurality of magnets 18 and a gas inlet plate 19.

The top electrode 17 is made of a nonmagnetizing metal, for example, aluminum. The gas inlet plate 19 can be made of a conducting material or of a nonconducting material. As the conducting material, aluminum, carbon or doped-Si may be used, and as the nonconducting material, quartz or ceramic may be used. The type of material used depends primarily on the type of plasma process performed. The thickness of the gas inlet plate 19 is usually around 10 mm or lower. The diameter of the gas inlet plate 19 is determined by the size of wafer diameter that is to be subjected to the plasma process.

Between the top electrode 17 and the gas inlet plate 19 there is a narrow space or gap which forms a gas reservoir 20. The gap width of the gas reservoir 20 is approximately 1 mm. A large number of gas inlet holes 19*a* are formed in the gas inlet plate 19. The diameter of the gas inlet holes 19*a* is preferably approximately between 0.5–0.6 mm. In order to have a uniform distribution of the gas, the gas inlet holes 19*a* are preferably formed with an equal distance between each other. The gas inlet holes 19*a* can be arranged at the corners of identical squares drawn on the gas inlet plate 19. The separation between two neighboring holes 19*a* is not critical and may vary from 5 mm to 30 mm. The number of gas inlet holes is preferably between 55–200, for example, and is preferably about 124.

On the lower surface of the top electrode 17, a plurality of holes 21 are made for the insertion of magnets 18. The holes 21 may be of a square shape or of a cylindrical shape depending on the shape of the magnets 18. The dimensions of the holes 21 can be larger than that of the magnets 18, for example, 0.5 mm larger.

The shape and dimensions of the magnets 18 are generally not critical. The cross sectional shape of the magnets 18 may be of a square shape or of a circular shape. If the cross sectional shape of the magnets is of a circular shape, the diameter thereof may vary in the range of 5 mm to 20 mm. If the cross sectional shape of the magnets is of a square shape, comparable dimensions are taken. The height of the magnets is also generally not critical and can vary from 2 mm to 20 mm. However, the magnets can have even a larger height. Usually with an increase of the thickness of the gas inlet plate 19, the height of the magnets 18 may also increase in order to have the magnetic field 22 made by the magnets 18 pass through a considerable volume of the gas inlet hole 19a.

The plurality of magnets 18 are preferably positioned above the gas inlet holes 19a, respectively. That is, the vertical axes of the gas inlet holes 19a and the corresponding magnets 18 may be substantially the same. This means that the magnet axis is aligned with the axis of the corresponding gas inlet hole. Therefore, the number of magnets can be the same as the number of gas inlet holes. In addition, one of the magnetic poles of each magnet 18 is directed towards the plasma. The magnetic field strength of the magnets 18 is generally not critical and can be varied in the range of 50 Gauss to 1 KGauss.

The magnets 18 can be arranged in at least two different arrangements depending on their dimensions, magnetic field strength and separation. In the arrangement where there is substantially no influence between a magnetic field 22 emitted from one magnet to the other neighboring magnets, the magnets 18 may be arranged arbitrarily such that the magnetic poles directed towards the plasma or gas inlet plate may be arranged in random order. To arrange this condition, the separation between the magnets 18 is increased, or the dimensions of the magnets 18 are decreased, or both of the above requirements may be needed. The pattern of magnetic flux lines 22a of the magnetic field 22 of this arrangement is shown in FIG. 2.

Another magnet arrangement is where a magnetic field 22 emitted from one magnet passes to neighboring magnets. That is, the magnets are closely spaced so as to have interaction due to the magnetic field between neighboring magnets. To arrange this condition, the separation between the magnets 18 is decreased, or the dimension and/or strength of the magnets is increased. In this case, the magnets 18 are preferably arranged having alternating polarities. The pattern of the magnetic flux lines 22a of the magnetic field 22 generated with this configuration of the magnets 18 is shown in FIG. 3.

Figure 2:
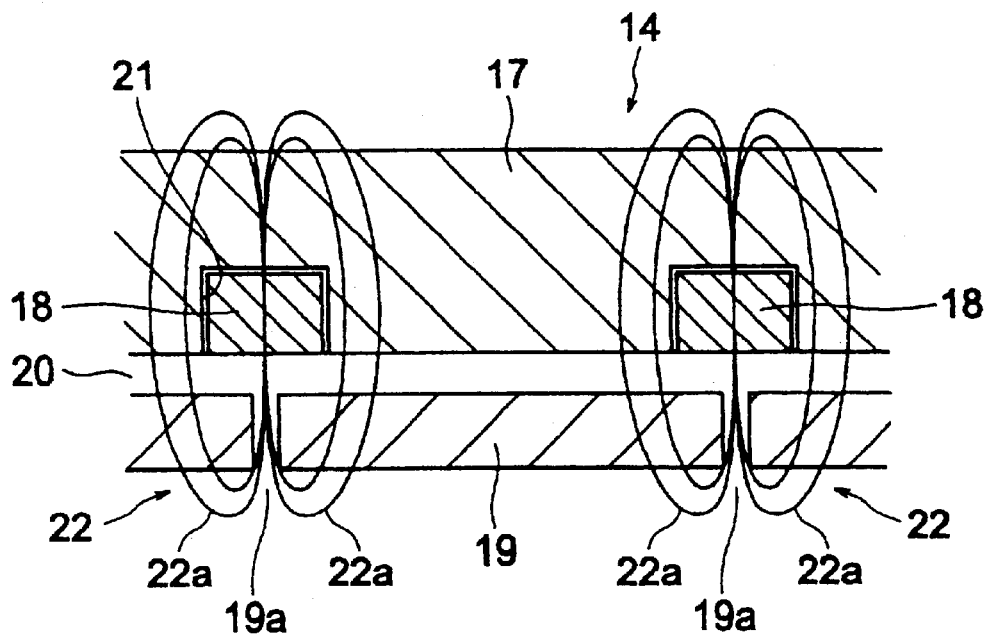
FIG. 2 shows a cross sectional view of magnetic flux lines emitted from two magnets of the gas inlet plate according to a preferred embodiment of the present invention.
Figure 3:
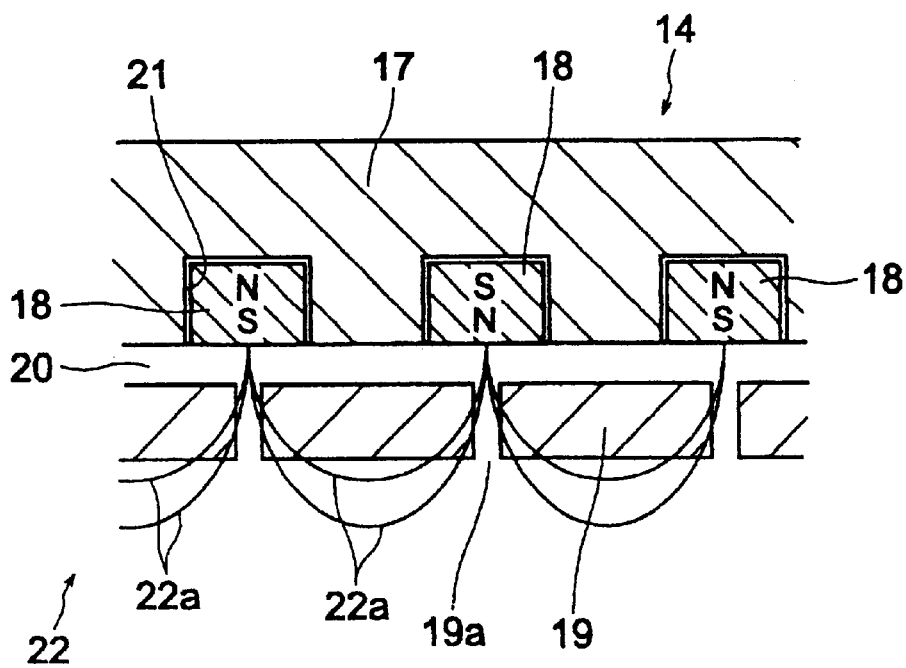
FIG. 3 shows a cross sectional view of magnetic flux lines emitted from two magnets of the gas inlet plate according to another preferred embodiment of the present invention.
Figure 4:
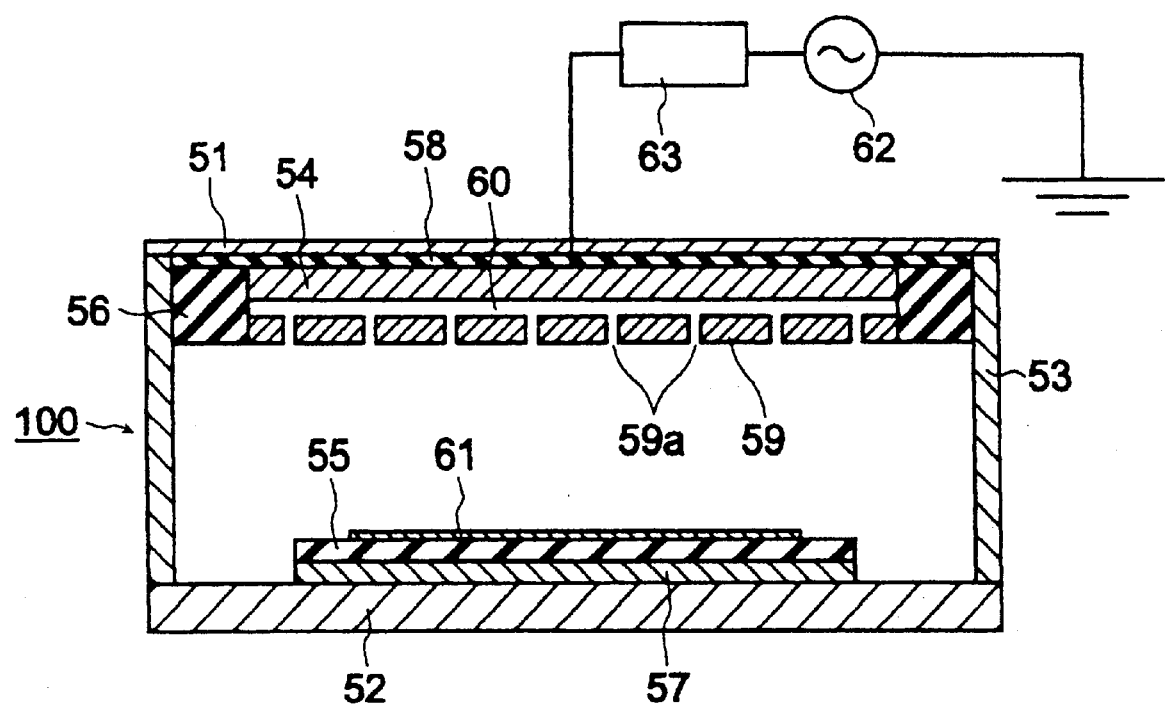
FIG. 4 shows a cross sectional view of a conventional capacitively coupled plasma source.
Figure 5:
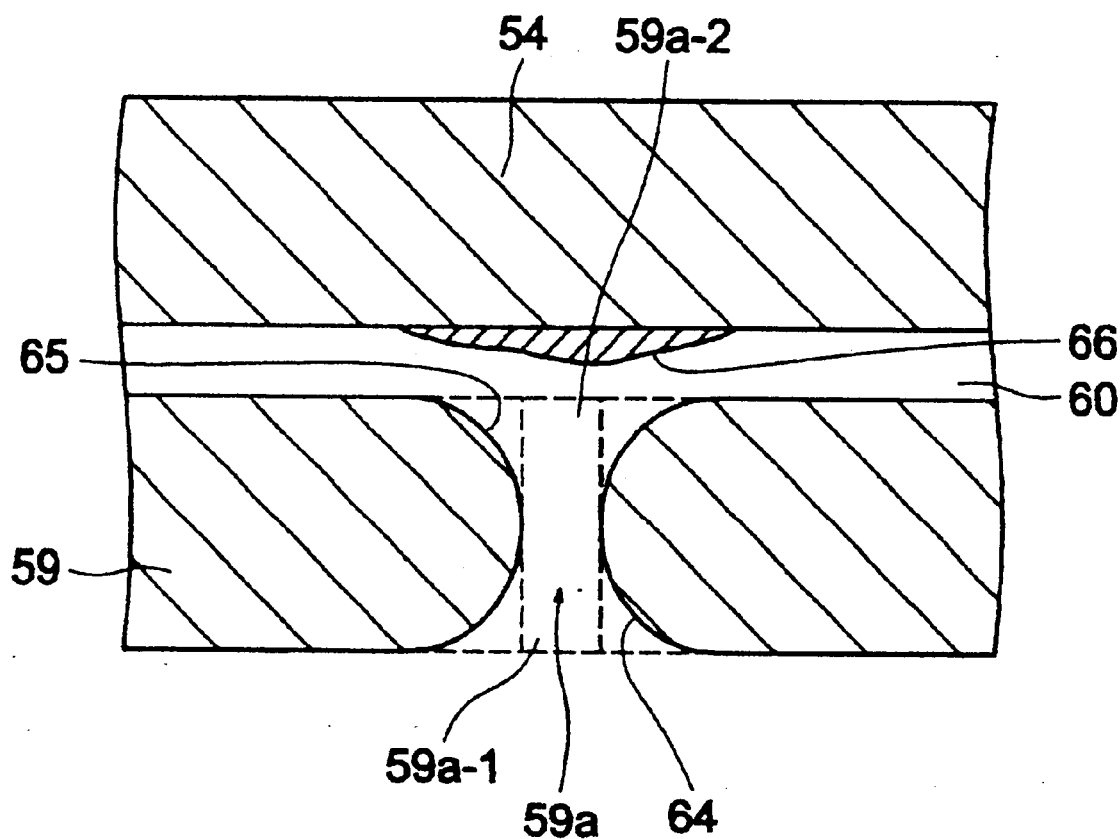
FIG. 5 shows an enlarged view of a cross section of an eroded gas inlet hole of a conventional capacitively coupled plasma source.

In the magnet arrangements shown in FIGS. 2 and 3, the magnetic field 22 passes through the gas inlet holes 19a. Moreover, the direction of the magnetic field 22 is in a substantially vertical direction, or in other words, in a direction substantially corresponding to the axis of the corresponding gas inlet hole 19a, especially at an upper end of the gas inlet hole 19a. The direction of the magnetic field 22 slightly deviates from the substantially vertical direction at a lower end of the gas inlet hole 19a. The extent of the deviation depends on the thickness of the gas inlet plate 19 and the strength of the magnetic field 22. However, by selecting a suitable strength of the magnetic field 22 and a thickness of the gas inlet plate 19, a higher magnetic field strength at the lower end of the gas inlet hole 19a can be obtained.

Further, the substrate holder 15 is arranged on the bottom plate 12 through the planar insulator 31. The substrate holder 15 is electrically isolated from the bottom plate 12. A substrate 32 to be processed is arranged on the substrate holder 15 in a horizontal state. In this case, for example, the diameter of the substrate is 200 mm and the diameter of the substrate holder 15 and the planar insulator 31 is 300 mm. Also, there is a planar insulator 33 arranged between the top electrode 17 and the top plate 11. The top electrode 17 is connected with an RF power source 34 via a matching circuit 35. A power line from the matching circuit 35 passes through the top plate 11 and the planar insulator 33 and is connected with the top electrode 17. The top electrode 17 is fed with RF electric power from the RF power source.

Next, the reduction of erosion in the gas inlet holes 19a will be discussed. Once the plasma is produced by the capacitively coupled mechanism, there is a substantially continuous ion bombardment onto the gas inlet plate 19 because of the negative dc bias voltage on the gas inlet plate 19. In the first working example, however, the magnets 18 are placed over each gas inlet hole 19a. The magnetic field due to the magnets 18 slightly penetrates into the plasma around the corresponding gas inlet hole 19a. Electrons in this magnetic field 22 are subjected to cyclotron rotation, and if the magnetic field 22 is strong, electrons are reflected back by a magnetic mirror reflection process. For these reasons, there is less electron bombardment around each of the gas inlet holes 19a compared to other areas of gas inlet plate 19. If the gas inlet plate 19 is made of an insulating material, the negative dc bias voltage around the gas inlet hole 19a is comparatively smaller. Thus, ions which bombard around the gas inlet hole 19a gain less energy. This prevents or minimizes the erosion in the gas inlet holes 19a.

In the presence of the magnetic field 22, ions are also subject to the cyclotron rotation. If the strength of the magnetic field 22 is relatively low or the ion energy is relatively low, the cyclotron radius of the ions becomes large. For example, the cyclotron radius of Ar+ of 0.026 eV in 100 Gauss magnetic field is about 1.4 cm. Due to the cyclotron rotation, ions are moved away from the gas inlet holes 19a. If the magnetic field 22 at the gas inlet holes 19a is strong enough, ions may be reflected back to the plasma. This process reduces the ion flux on and around the gas inlet holes 19a, even if the gas inlet plate 19 is made of a conducting material.

Another reason for the reduction of erosion in the gas inlet holes 19a, which is interrelated to the above mentioned discussion, is that the plasma density increases between the magnets 18 (or between the gas inlet holes 19a) and decreases at the magnetic poles. Therefore, the ion density around the gas inlet holes 19a is relatively low, thereby the ion flux around the gas inlet holes 19a is also relatively low. This results in a decrease of the erosion rate in the gas inlet holes 19a.

Moreover, at the upper ends of the gas inlet holes 19a, the magnetic field 22 is strong and lies almost in a substantially vertical direction. This substantially prevents the lateral motion of the electrons. Without the lateral motion of the electrons, a stable plasma cannot be made in this region. Thus the generation of micro-plasma in the gas reservoir 20 is substantially prevented. Since there is substantially no plasma in the gas reservoir 20, there is no erosion of the upper ends of the gas inlet hole 19a.

As explained above, the erosion of gas inlet holes 19a can be reduced or prevented by placing separate magnets 18 over each gas inlet hole 19a. Again, since there is less or no gas inlet hole erosion, the thickness of the gas inlet plate 19 can be reduced. Moreover, since there is substantially no plasma in the gas reservoir region, the film deposition on the lower surface of the top electrode 17 is minimized. Thus the particle contamination problem due to the above polymer layer deposited on the lower surface of the top electrode 17 is also minimized.

In accordance with the present invention, the planar gas introducing unit of the CCP reactor includes a gas inlet plate having a plurality of magnets which can prevent or minimize gas inlet hole erosion. This results in an increase in the service life of the gas inlet plate and its utilization efficiency.

While the invention has been described in detail with reference to preferred embodiments thereof, it will be apparent to one skilled in the art that various changes can be made, and equivalents employed, without departing from the scope of the invention.

DEPOSIT OF COMPUTER PROGRAM LISTINGS

Not applicable

What is claimed is:

1. A planar gas introducing unit of a capacitively coupled plasma (CCP) reactor, the planar gas introducing unit comprising:
   a gas inlet plate having a plurality of gas inlet holes;
   a top electrode spaced from the gas inlet plate;
   a gas reservoir formed between the top electrode and the gas inlet plate; and
   wherein the top electrode includes a plurality of magnets arranged such that the plurality of magnets operate to substantially prevent an enhanced erosion of the plurality of gas inlet holes.

2. The planar gas introducing unit of a capacitively coupled plasma reactor of claim 1, wherein the plurality of magnets are situated in a spaced relationship relative to one another on a surface of the top electrode and are arranged across from the plurality of gas inlet holes of the gas inlet plate.

3. The planar gas introducing unit of a capacitively coupled plasma reactor of claim 2, wherein each of said plurality of magnets is arranged to correspond to a gas inlet hole such that an axis of each of said plurality of magnets is aligned with an axis of a corresponding gas inlet hole and magnetic fields emitted from said plurality of magnets pass through the gas inlet holes in a direction substantially corresponding to the axis of the corresponding gas inlet hole.

4. The planar gas introducing unit of a capacitively coupled plasma reactor of claim 3, wherein the plurality of magnets are arranged in the top electrode such that a magnetic field emitted from one of said plurality of magnets does not influence a magnetic field emitted from another neighboring magnet of the plurality of magnets.

5. The planar gas introducing unit of a capacitively coupled plasma reactor of claim 4, wherein each of the plurality of magnets has a magnetic pole having a polarity which is directed towards the gas inlet plate, the magnetic poles being arranged in a random order.

6. The planar gas introducing unit of a capacitively coupled plasma reactor of claim 3, wherein the plurality of magnets are arranged in the top electrode such that a magnetic field emitted from one of said plurality of magnets is influenced by a magnetic field emitted from another neighboring magnet of the plurality of magnets.

7. The planar gas introducing unit of a capacitively coupled plasma reactor of claim 6, wherein each of the plurality of magnets has a magnetic pole having a polarity which is directed towards the gas inlet plate, the magnetic poles being arranged having alternating polarities.

8. The planar gas introducing unit of a capacitively coupled plasma reactor of claim 3, wherein the number of magnets is the same as the number of gas inlet holes.

9. The planar gas introducing unit of a capacitively coupled plasma reactor of claim 1, wherein the plurality of magnets are arranged in holes formed in the surface of the top electrode.

10. The planar gas introducing unit of a capacitively coupled plasma reactor of claim 1, wherein the top electrode is made of a nonmagnetizing metal.

11. The planar gas introducing unit of a capacitively coupled plasma reactor of claim 10, wherein the nonmagnetizing metal is aluminum.

12. The planar gas introducing unit of a capacitively coupled plasma reactor of claim 1, wherein the gas inlet plate is made of a conducting material.

13. The planar gas introducing unit of a capacitively coupled plasma reactor of claim 12, wherein the conducting material is a material selected from the group consisting of aluminum, carbon and doped-Si.

14. The planar gas introducing unit of a capacitively coupled plasma reactor of claim 1, wherein the gas inlet plate is made of a non-conducting material.

15. The planar gas introducing unit of a capacitively coupled plasma reactor of claim 14, wherein the non-conducting material is quartz or ceramic.

16. A planar gas introducing unit of a capacitively coupled plasma (CCP) reactor, the planar gas introducing unit comprising:
   a gas inlet plate having a plurality of gas inlet holes;
   a top electrode spaced from the gas inlet plate;
   a gas reservoir formed between the top electrode and the gas inlet plate; and
   wherein the top electrode includes a plurality of magnets arranged such that magnetic fields emitted from said plurality of magnets pass through the gas inlet holes of the gas inlet plate.

17. The planar gas introducing unit of a capacitively coupled plasma reactor of claim 16, wherein the plurality of magnets are situated in a spaced relationship relative to one another on a surface of the top electrode.

18. The planar gas introducing unit of a capacitively coupled plasma reactor of claim 17, wherein the plurality of magnets are arranged in the top electrode such that a magnetic field emitted from one of said plurality of magnets does not influence a magnetic field emitted from another neighboring magnet of the plurality of magnets.

19. The planar gas introducing unit of a capacitively coupled plasma reactor of claim 18, wherein each of the plurality of magnets has a magnetic pole having a polarity which is directed towards the gas inlet plate, the magnetic poles being arranged in a random order.

20. The planar gas introducing unit of a capacitively coupled plasma reactor of claim 17, wherein the plurality of magnets are arranged in the top electrode such that a magnetic field emitted from one of said plurality of magnets is influenced by a magnetic field emitted from another neighboring magnet of the plurality of magnets.

21. The planar gas introducing unit of a capacitively coupled plasma reactor of claim 20, wherein each of the plurality of magnets has a magnetic pole having a polarity which is directed towards the gas inlet plate, the magnetic poles being arranged having alternating polarities.

22. A planar gas introducing unit of a capacitively coupled plasma (CCP) reactor, the planar gas introducing unit comprising:
   a gas inlet plate having a plurality of gas inlet holes;
   a top electrode spaced from the gas inlet plate;
   a gas reservoir formed between the top electrode and the gas inlet plate; and wherein the top electrode includes a plurality of magnets which are arranged across from the plurality of gas inlet holes of the gas inlet plate and an axis of each of said plurality of magnets is aligned with an axis of a corresponding gas inlet hole.

23. The planar gas introducing unit of a capacitively coupled plasma reactor of claim 22, wherein the plurality of magnets are situated in a spaced relationship relative to one another on a surface of the top electrode.

24. The planar gas introducing unit of a capacitively coupled plasma reactor of claim 23, wherein the plurality of magnets are arranged in the top electrode such that a magnetic field emitted from one of said plurality of magnets does not influence a magnetic field emitted from another neighboring magnet of the plurality of magnets.

25. The planar gas introducing unit of a capacitively coupled plasma reactor of claim 24, wherein each of the plurality of magnets has a magnetic pole having a polarity which is directed towards the gas inlet plate, the magnetic poles being arranged in a random order.

26. The planar gas introducing unit of a capacitively coupled plasma reactor of claim 23, wherein the plurality of magnets are arranged in the top electrode such that a magnetic field emitted from one of said plurality of magnets is influenced by a magnetic field emitted from another neighboring magnet of the plurality of magnets.

27. The planar gas introducing unit of a capacitively coupled plasma reactor of claim 26, wherein each of the plurality of magnets has a magnetic pole having a polarity which is directed towards the gas inlet plate, the magnetic poles being arranged having alternating polarities.

* * * * *